United States Patent [19]

Challa

[11] Patent Number: 5,323,351

[45] Date of Patent: Jun. 21, 1994

[54] METHOD AND APPARATUS FOR PROGRAMMING ELECTRICAL ERASABLE PROGRAMMABLE READ-ONLY MEMORY ARRAYS

[75] Inventor: Nagesh Challa, Sunnyvale, Calif.

[73] Assignee: Nexcom Technology, Inc., Sunnyvale, Calif.

[21] Appl. No.: 897,215

[22] Filed: Jun. 10, 1992

[51] Int. Cl.$^5$ .............................................. G11C 7/00
[52] U.S. Cl. ................... 365/218; 365/185; 365/900
[58] Field of Search ............... 365/185, 104, 200, 201, 365/189.07, 189.09, 218, 900

[56] References Cited

U.S. PATENT DOCUMENTS

| | | | |
|---|---|---|---|
| 4,460,982 | 7/1984 | Gee et al. | 365/104 |
| 4,698,787 | 10/1987 | Mukherjee et al. | 365/186 |
| 4,996,571 | 2/1991 | Kume et al. | 357/23.5 |
| 4,996,668 | 2/1991 | Paterson et al. | 365/185 |
| 5,132,935 | 7/1992 | Ashmore, Jr. | 365/185 |
| 5,142,496 | 8/1992 | Van Buskirk | 365/185 |
| 5,163,021 | 11/1992 | Mehrotra et al. | 365/104 |

OTHER PUBLICATIONS

Robinson, "Endurance Brightens the Future of Flash," Technological Horizons, Nov. 1988, pp. 167–169.
Wilson et al, "Intel Flash Prices Rock Market," Electronic Engineering Times, Apr. 27, 1992, p. 1 and p. 93.

*Primary Examiner*—Eugene R. LaRoche
*Assistant Examiner*—Vu Le
*Attorney, Agent, or Firm*—Skjerven, Morrill, MacPherson, Franklin & Friel

[57] ABSTRACT

A method of controllably programming an electrically erasable programmable read only memory comprises the step of erasing a group of memory cells of the memory into a high threshold state. The group including data cells and monitor cells. The data cells of the group are programmed in accordance with data presented to the memory, and the monitor cells of the group are programmed to a low threshold state. The threshold voltage of the monitor cells is sampled, and the monitor cell programming step and the sampling step are repeated until an excessively low threshold voltage is sampled. If the sampling is done with a sampling voltage higher than the read voltage, the cell threshold voltage generally is not excessive. In any event, an excessively low threshold is raised by a controlled erasure.

28 Claims, 3 Drawing Sheets

METHOD AND APPARATUS FOR PROGRAMMING ELECTRICAL ERASABLE PROGRAMMABLE READ-ONLY MEMORY ARRAYS

BACKGROUND OF THE INVENTION

1. Field of Use

The present invention relates to memory arrays, and more particularly to methods and apparatus for programming electrically erasable programmable read only memory arrays.

2. Description of Related Art

Various memory arrays have been developed using various types of settable threshold memory cells. For example, one conventional type of array, which is described in FIG. 5a of U.S. Pat. No. 4,698,787, issud Oct. 6, 1987 to Mukherjee et. al., uses a two transistor electrically erasable programmable read only memory ("E$^2$-PROM") cell. One transistor of this cell is a select transistor. The other transistor of this cell is a floating gate transistor in which Fowler-Nordheim tunneling is used to transport charge to or from the floating gate for storing a binary value by selectively setting the transistor to either a low threshold voltage ("$V_t$") state or a high $V_t$ state. The charge is transported through a tunnel dielectric insulating the transistor drain from the floating gate. As various conventions appear in the literature for the terms "erase" and "program," the terms low $V_t$ and high $V_t$ are used herein when generally referring to the state of a memory cell. Typically, about twenty volts is needed to alter the $V_t$ state of the transistor. In a typical E$^2$PROM memory array, initially all cells of the cell array are placed into a high $V_t$ state by grounding the drain and pulsing the gate at a potential of about plus twenty volts. Then, the desired logic value is written into the array by placing selected cells into a low $V_t$ state by grounding the gate and pulsing the drain of the selected cells at a potential of about plus twenty volts.

Various memory cell arrays have been proposed that are not based on the two transistor cell. For example, The previously mentioned Mukherjee et. al. patent discloses in FIG. 5b another array based on a single asymmetrical source/drain E$^2$PROM memory cell that is placed into a high $V_t$ state using hot electrons in a manner similar to conventional EPROM transistors, and placed into a low $V_t$ state in a manner similar to a conventional E$^2$PROM cell except that the tunnel dielectric is located between the source and the floating gate. In this array, initially all cells of the array are placed in a low $V_t$ state by grounding the word lines and pulsing the common source line. A byte erase scheme is also proposed in FIG. 5d of Mukherjee et. al. that incorporates an additional transistor for each word. Cells are placed in a high $V_t$ state by channel hot electron injection into the floating gate, which is achieved by (a) grounding the common source line, raising the drain voltage of the selected cells, and pulsing the gate of the selected cells with positive voltage. Channel hot electron injection occurs in only selected cells having a raised drain voltage. Selected cells having a grounded drain do not assume a high $V_t$ state since they lack channel hot electron generation, and deselected cells do not assume a high $V_t$ state since they lack hot electron transport.

The memory cell used in the Mukherjee et. al. array is a type of E$^2$ PROM cell commonly known as flash memory. Flash memory technology as it is generally referred to involves channel hot electron injection to achieve the high $V_t$ state, and Fowler-Nordheim tunneling to achieve the low $V_t$ state. Flash memory is described in further detail in K. Robinson, "Endurance Brightens the Future of Flash," Electronic Component News, November 1988.

As generally envisioned, flash memory cells are single transistors cells. A flash memory avoids over-erasure of its cells into depletion by using a complex and time consuming software-implemented technique. For example, to write a byte of data into a flash memory, a block of the flash memory is selected, preconditioned, erased, and entirely rewritten. This process can take hundreds of milliseconds. See R. Wilson and D. Lammers, "Intel flash prices rock market," Electronic Engineering Times, Apr. 27, 1992, p. 92–93. Unfortunately, the techniques generally used to prevent individual cells from over-erasing into depletion, a write operation is cumbersome and time-consuming, requiring typically hundreds of milliseconds.

SUMMARY OF THE INVENTION

In one embodiment, the invention is a method of controllably programming an electrically erasable programmable read only memory to prevent an excessively low threshold voltage from being stored in the memory cells thereof. The embodiment comprises the steps of erasing a group of memory cells of the memory into a high threshold state, the group including data cells and monitor cells. The data cells of the group are programmed in accordance with data presented to the memory, and the monitor cells of the group are programmed to a low threshold state. The threshold voltage of the monitor cells is sampled, and the monitor cell programming step and the sampling step are repeated until an excessively low threshold voltage is sampled.

DESCRIPTION OF THE PREFERRED EMBODIMENT

Figure 1:
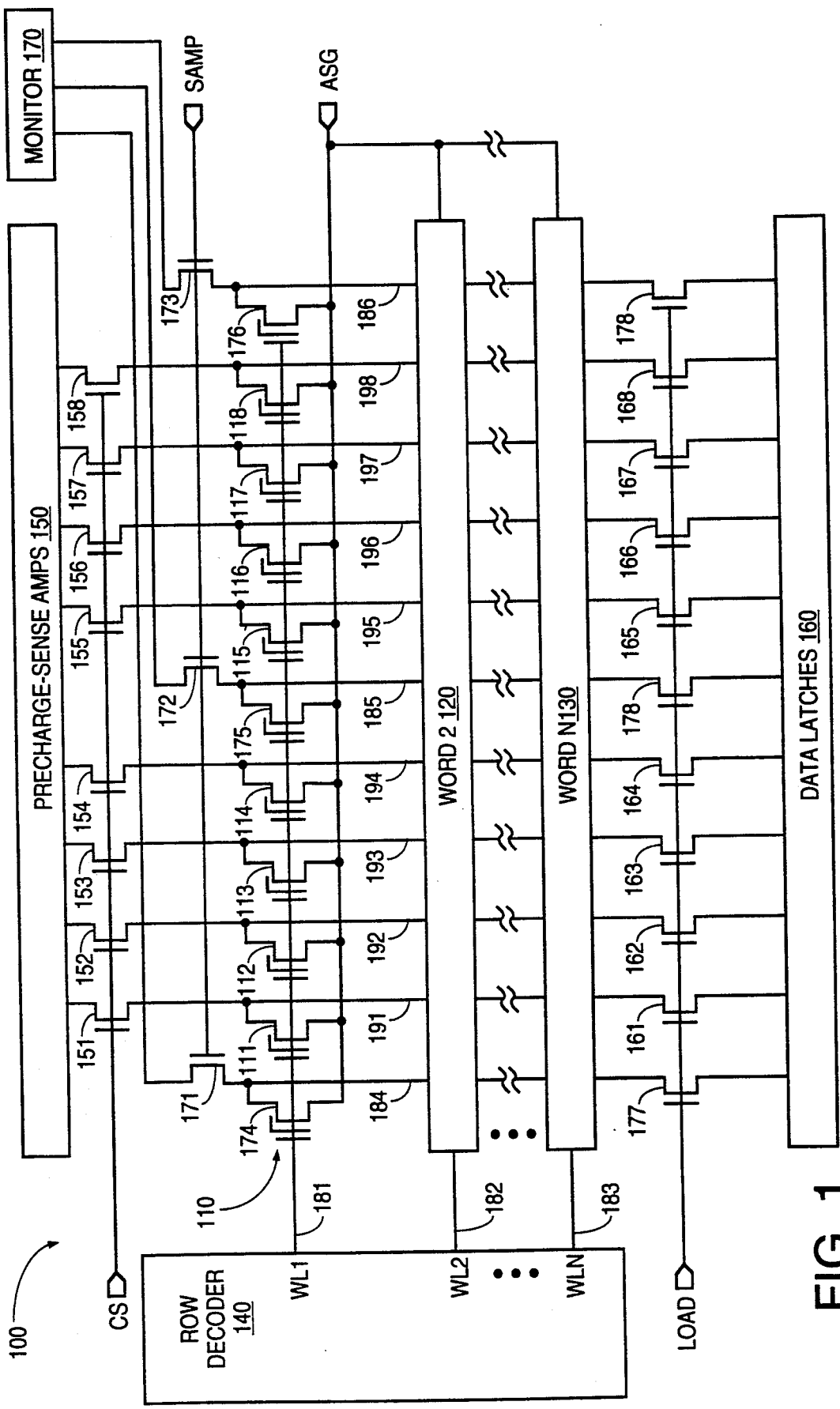
FIG. 1 is a circuit schematic diagram of an electrically erasable programmable read-only memory architecture, in accordance with the invention.

A memory architecture 100 is shown in FIG. 1. The memory 100 is illustrative in that the method and apparatus for programming the memory 100 described herein are applicable to other memory architectures as well. For example, another memory architecture is described in copending and commonly assigned U.S. Pat. application Ser. No. 07/896,772 entitled Electrical Erasable Programmable Read-Only Memory Array, naming Nagesh Challa as inventor and filed on even data herewith, which is incorporated herein by reference.

Memory 100 includes a number N of rows of memory cells, which generally are considered to be words of memory or, in a page-associative memory, a number N of pages of memory. Words 110, 120 and 130 are shown.

Each word of memory 100 Comprises a number of memory cells. As shown in FIG. 1, the word 110 comprises data memory cells 111, 112, 113, 114, 115, 116, 117, and 118, and monitor Cells 174, 175 and 176. The second through Nth words, indicated generally at 120 and 130, are substantially identical to the word 110. Each of the data memory cells 111-118 has a control terminal connected to a word line from port WL1 of row decoder 140, one controlled terminal connected to an associated bit line, and the other controlled terminal connected to an array ground line ASG. In the embodiment of FIG. 1, the memory cells 111-118 and 174-176 are electrically erasable programmable read-only memory ("EEPROM") transistors, each having a control gate that is connected to a word line and functions as the control terminal, a drain that is connected to an associated bit line and functions as one of the controlled terminals, and a source that is connected to the array ground line ASG and functions as a second controlled terminal. The bit lines 191-198 associated with data transistors 111-118 are connected to precharge and sense amplifier circuits 150 through respective column select transistors 151-158, which are controlled by column select signal CS.

Circuits peripheral to the memory cell array include row decoder 140 having illustrative word select ports WL1 through WLN, where N is the number of words in the memory 100. Word select ports WL1-WLN are connected to word lines. With respect to word 110, for example, the word line 181 from the word select port WL1 is connected to the gates of memory transistors 111-118 and monitor memory transistors 174-176. The bit lines 191-198 are connected to respective ports of a bit line precharge and sense amplifier circuit 150 through respective column select transistors 151-158, which are controlled by column select signal CS. The precharge and sense amplifier circuit 150 is of any suitable conventional design. The bit lines 184, 185 and 186 are connected to respective ports of a monitor circuit 170 through respective column select transistors 171, 172 and 173, which are controlled by sampling signal SAMP. Monitor circuit 170 is a bit line precharge and sense amplifier circuit similar to the bit line precharge and sense amplifier circuit 150. The bit lines 191-198 are also connected to respective ports of a data latches circuit 160 through respective column select transistors 161-168, which are controlled by load signal LOAD applied to their gates. The data latches circuit 160 is of any suitable conventional design. The bit lines 184, 185 and 186 also are connected to the data latches 160 through respective column select transistors 177, 178 and 179, which are controlled by the signal LOAD.

Figure 2:
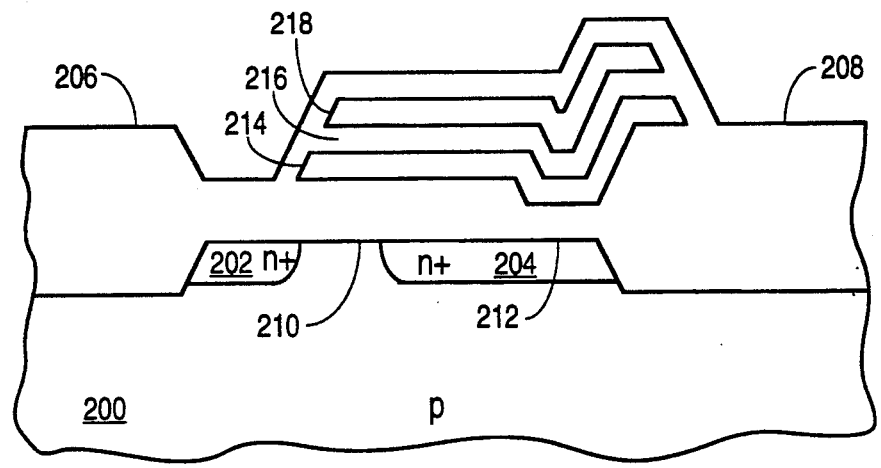
FIG. 2 is a cross section of a memory transistor implemented in E$^2$PROM technology.
Figure 3:
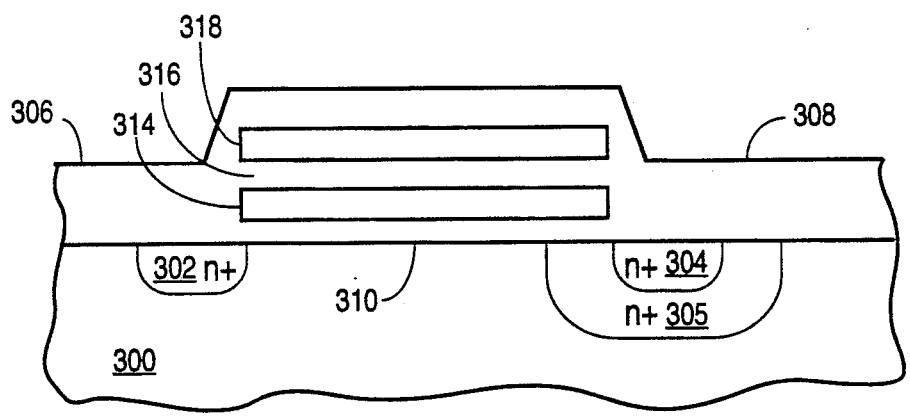
FIG. 3 is a cross section of a memory transistor implemented in FLASH memory technology.

Each of the memory cells of FIG. 1 is a settable threshold device. Suitable devices are illustrated in FIGS. 2 and 3 are described in numerous publications, including the compendium by Cheming Hu, Nonvolatile Semiconductor Memories, IEEE Publications, New York, 1991. The device of FIG. 2 is a floating gate transistor fabricated in accordance with a conventional E$^2$PROM process. Source 202 and drain 204 are formed in substrate 200, within an active area bounded by field oxide 206 and 208. A floating gate 214 is provided over the channel region between the source 202 and drain 204, and is insulated from the channel by a gate dielectric 210. A portion of the floating gate 214 also overlays a portion of the drain 204, from which it is insulated by a thin tunnel dielectric 212. A control gate 218 overlays the floating gate 214, and is insulated from the floating gate 214 by an interpoly dielectric 216. The device of FIG. 3 is a floating gate transistor fabricated in accordance with a conventional flash memory process. Source 302 and a double diffused drain comprising sections 304 and 305 are formed in substrate 300, within an active area bounded by dielectric 306 and 308. A floating gate 314 is provided both over the drain region 305 and over the channel region between the source 302 and drain region 305, and is insulated therefrom by a uniform dielectric layer 310, which comprises both gate and tunnel dielectric. A control gate 318 overlays the floating gate 314, and is insulated from the floating gate 314 by an interpoly dielectric 316. Although the cell of FIG. 3 shows a double diffused drain comprising regions 304 and 305, a suitable underlay can be achieved without double diffusion. Moreover, although the source region 302 is shown with essentially no underlay, a source region having greater underlay may be fabricated if desired. Processes suitable for fabricating the transistors of FIGS. 2 and 3 are well known in the art.

Programming and erasing of a floating gate transistor such as those shown in FIGS. 2 and 3 is based on Fowler-Nordheim tunneling. The value of $V_t$ is variable, depending on the type and thickness of the dielectric (generally referred to as the "coupling ratio") through which the tunneling occurs, as well as the voltage applied and the nature and duration of application. Illustratively, a suitable coupling ratio is 0.65.

The memory 100 of FIG. 1 operates as follows, assuming use of the illustrative floating gate MOSFET described above with reference to FIG. 3. An illustrative set of voltages is summarized in Table 1 below for both selected and deselected rows in erase, write, and read modes. It will be appreciated that these values are illustrative, and that similar operation can be achieved using different values of voltage and even a combination of positive and negative voltages, as described in the aforementioned copending Challa application, and even different types of adjustable threshold memory cells.

TABLE 1

| MODE | STATUS | VWL | VBL | VASG | Vt |
|---|---|---|---|---|---|
| ERASE | Selected | 20 | 0 | 0 | >4 |
|  | Deselected | 0 | 0 | 0 | Unchanged |
| WRITE | Selected | −15 | 5 (binary 0) | 0 | See Text |
|  |  |  | 0/F (binary 1) | 0 | >4 |
|  | Deselected | 0 | 5/0 | 0 | Unchanged |
| READ | Selected | 2.5 | 1.5 | 0 |  |
|  | Deselected | 0 | F | 0 |  |

"Erase" mode is defined as establishing a high $V_t$ in the memory transistors of the memory 100 so that they are nonconductive in the read mode. As nonconductive cells are sensed as logic one in the read mode, the result of an erase is to place logic ones into the memory cells associated with a selected row. Assume, for example, that erasure of memory transistors 111-118 in word 110 is desired. The control gates of transistors 111-118 and 174-176 are taken to a high voltage such as 20 volts. The control gates of transistors associated with deselected word lines are held at 0 volts. The drains of the memory transistors in the memory 100, including memory transistors 111-118 and 174-176, are held at 0 volts by loading logic one values into the data latches 430 and asserting signal LOAD positive. The sources of the memory transistors in the memory 100 are held at zero volts. Transistors 111-118 and 174-176 thereby have twenty volts applied across their respective control gates and drains with the control gates positive relative to the drains, so that electrons tunnel from the drain through the tunnel oxide to the floating gate to raise $V_t$ to greater than four volts. The memory transistors of the other words in the memory 100, for example words 120 and 130, have zero volts applied across their respective control gates and drains, which is insufficient to disturb the data in these cells. Of course, the entire memory array of the memory 100 can be erased, if desired, by taking all of the word lines WL1-WLN to 20 volts.

"Write" mode is defined as establishing a low $V_t$ in particular memory transistors of the memory 100 so that they are conductive in the read mode. Illustratively, a conductive memory transistor is sensed as a logic zero, so the memory transistors of memory 100 are "erased" into a logic one state, and selected transistors subsequently are "programmed" into a logic zero state. The binary value to be stored is latched by the data latches 160, and furnished to respective bit lines of the memory transistors 111-118.

A logic one is written into a memory transistor such as transistor 111, for example, by not disturbing the state of the transistor, which typically is logic one from the prior erase mode operation. Zero volts (or alternatively no voltage if the latch outputs are floating) is applied to the drain of the transistor 111. If word 110 is selected, transistor 111 has fifteen volts across its control gate and drain, with the control gates being negative relative to the drains, which is insufficient to cause tunneling. Hence, the logic one erased state is unchanged and $V_t$ remains greater than four volts. If word 110 is deselected, transistor 111 has zero volts across its control gate and drain, which is insufficient to cause tunneling. Hence, the logic one erased state is unchanged and $V_t$ remains greater than four volts.

A logic zero is written to a memory transistor such as transistor 111, for example, by applying five volts to the drain of the transistor 111 through the data latches circuit 160. Note that a logic zero is always written to the monitor transistors 174, 175 and 176. Word 110 is selected by bring word line WL1 to minus fifteen volts. Signal LOAD is asserted positive, thereby turning on the column select transistors 161-168 and 177-179 to connect the bit lines 191-198 and 184-186 to the data latches 160. Note that the ports of the data latches circuit 160 associated with the monitor transistors 174, 175 and 176 are always at logic zero in write mode, when signal LOAD is asserted positive, so that the monitor transistors 174. 175 and 176 are always written into a lower $V_t$ condition. The twenty volts across the control gate and drain of transistor 111, with the control gate being negative relative to the drain, is sufficient to cause tunneling. Tunneling proceeds from the floating gate to the drain, which causes the $V_t$ of transistor 36 to decrease. If word 110 is deselected, transistor 111 has five volts across its control gate and drain, with the control gates being negative relative to the drains, which is insufficient to cause tunneling. Hence, the logic one erased state is unchanged and $V_t$ remains greater than four volts.

Read mode begins by precharging all bit lines in the memory 100 to 1.5 volts. The common source ASG is at ground. If word 110 is being read, for example, selected word line WL1 is brought to 2.5 volts while the other word lines WL2-WLN are held at zero volts. Transistors in the selected word 110 having a high $V_t$ of about four volts or greater do not conduct, and the lack of current flow in the respective associated bit lines is read by sense amplifiers 150 as a logic one. Transistors in the selected word 110 having a low $V_t$ under two and a half volts conduct, and the current flow in the respective associated bit lines is read by sense amplifiers 150 as a logic zero. Transistors in deselected words of the memory 100 do not conduct, unless their $V_t$ is negative.

Negative $V_t$ results from a poorly controlled write to a memory transistor of a selected word, causing the transistor to be written into depletion. Because some read methods are not accurate when negative $V_t$ cells are present in the memory 100, the memory 100 includes a precharge and sense amplifier circuit and a number of extra memory monitor transistors distributed through the memory array for the purpose of detecting when transistors of the memory 100 are about to be written into depletion. Writing is stopped before any memory transistor in the memory 100 is written into depletion. Alternatively, if any memory transistor is written into depletion, the $V_t$ of the transistors in the selected word is incrementally raised until no transistor has a negative $V_t$.

To facilitate the controlled programming of the memory transistors in the memory 100, each row is provided a number of monitor transistors. For example, word 110 is provided with the three monitoring transistors 174-176, the drains of which are connected to monitor bit lines 184, 185 and 186. Monitor bit lines 184, 185 and 186 are connected to the monitor circuit 170, which is a precharge and sense amplifier circuit similar to the precharge and sense amplifier circuit 150, through respective column select transistors 174, 175 and 176. Monitor bit lines 184, 185 and 186 also are connected to associated latched in the data latches circuit 430, which contain a logic one in erase mode and a logic zero in write mode, through respective column load transistors 177, 178 and 179.

The Write operation is performed as follows, assuming word 110 is being written. Data, including the monitor data of logic zero, is loaded into data latches 160. The memory 100 is placed into write mode, signal LOAD is asserted high to couple the data latches 160 to the bit lines 191-198 and 184-186, and port WL1 of the row decoder connected to word line 181 is brought to minus fifteen volts for a period sufficient to draw some charge off of the floating gates of the associated monitor transistors 174-176 and off of those memory transistors 111-118 that are being programmed to logic zero. The amount of charge preferably is insufficient to write these transistors into depletion. Next, the $V_t$ of the monitor transistors 174, 175 and 176 in word 110 is sampled by asserting sampling select signal SAMP high to turn ON sampling select transistors 171, 172 and 173, bringing Word line 181 to a nonzero read Voltage of, for example, plus one volt, and sampling the current on bit lines 184, 185 and 186. If no current is sensed, word line 181 of the row decoder is again brought to minus fifteen volts for a period sufficient to draw some more charge off of the floating gates of the associated monitor transistors 174-176 and to draw some more charge off of those memory transistors 111-118 that are being programmed to logic zero. Preferably, the period is insufficient to write these transistors into depletion, and the monitor transistors 174, 175 and 176 are again sampled. The write-sample sequence is repeated until current is sensed on one of the bit lines 184, 185 and 186. When current is sensed, the word line 181 is brought to zero volts and the bit lines 184, 185 and 186 are again sampled to confirm that none of the monitor transistors 174, 175 and 176 has been written into depletion.

Generally, no current is sensed with the word line 110 at zero. However, if current is sensed, then the memory transistors of the memory 100 have been overwritten. In this event, the word 110 is again erased without disturbing the other words of the memory 100, and the write operation is repeated. Alternatively, the memory transistors 111–118 and the monitor transistors 174–176 can be slightly erased in a controllable manner so as to slightly raise their $V_t$, and the bit lines 184, 185 and 186 are again sampled to determine whether any of the monitor transistors 174, 175 and 176 remains in depletion. If none remain in depletion, the memory 100 is successfully written. If one or more remain in depletion, the erase-sample cycle is repeated until none of the monitor transistors remain in depletion.

Alternatively, the memory transistors 111–118 and the monitor transistors 174–176 could be written in such a manner that they are likely to be overwritten, followed by a number of erase-sample cycles as described above to progressively increase their $V_t$ until none remain in depletion. At this point, the memory 100 is successfully written.

The write period depends on the memory transistor parameters and other considerations. For example, one simple technique is to repeatedly apply the select voltage to the word line in 500 microsecond pulses until a successful write is detected. This technique could result in overerasure if significant charge is removed from the floating gates during the 500 microsecond period. Alternatively, the use of a progressively shorter period, decreasing, for example, to 200 microseconds and then to 100 microseconds, generally would avoid overerasure.

The erase period to controllably raise negative $V_t$ also proceeds either in uniform increments or progressively decreasing increments. For example, a uniform increment of 100 microseconds is suitable.

Many write mode variations are possible. For example, further assurance of no negative $V_t$ cells can be had by monitoring all cells of the selected word for negative $V_t$, even though the monitoring transistors are distributed throughout the memory array of the memory 100 so as to obtain a representative sample. Note that an adequate representative sample is important particularly in large memory arrays, since cells in widely spaced regions of the memory array may have different characteristics. Alternatively, data cells can be used as monitoring cells, on the assumption that at least some of the data cells are being written with logic zero bits. However, the use of dedicated monitor cells ensures that regardless of the data being programmed, the dedicated monitor cells will always go through the erase and write logic zero cycle.

The memory 100 is implemented in a conventional manner in silicon, using a grounded substrate. Alternatively, the memory 100 is implemented using a substrate that is held at a potential of, for example, about minus one volt. This allows the rows 110, 120 and 130 to be switched on and off quickly, without loss of access time. Moreover, a small negative bias reduces the diffusion capacitances and raises the nominal $V_t$ of all of the NMOS memory transistors, thereby helping to maintain the ability to read the selected cells in the memory array even if some of the cells degrade, or experience a drop in their $V_t$, during the memory lifetime.

Figure 4:
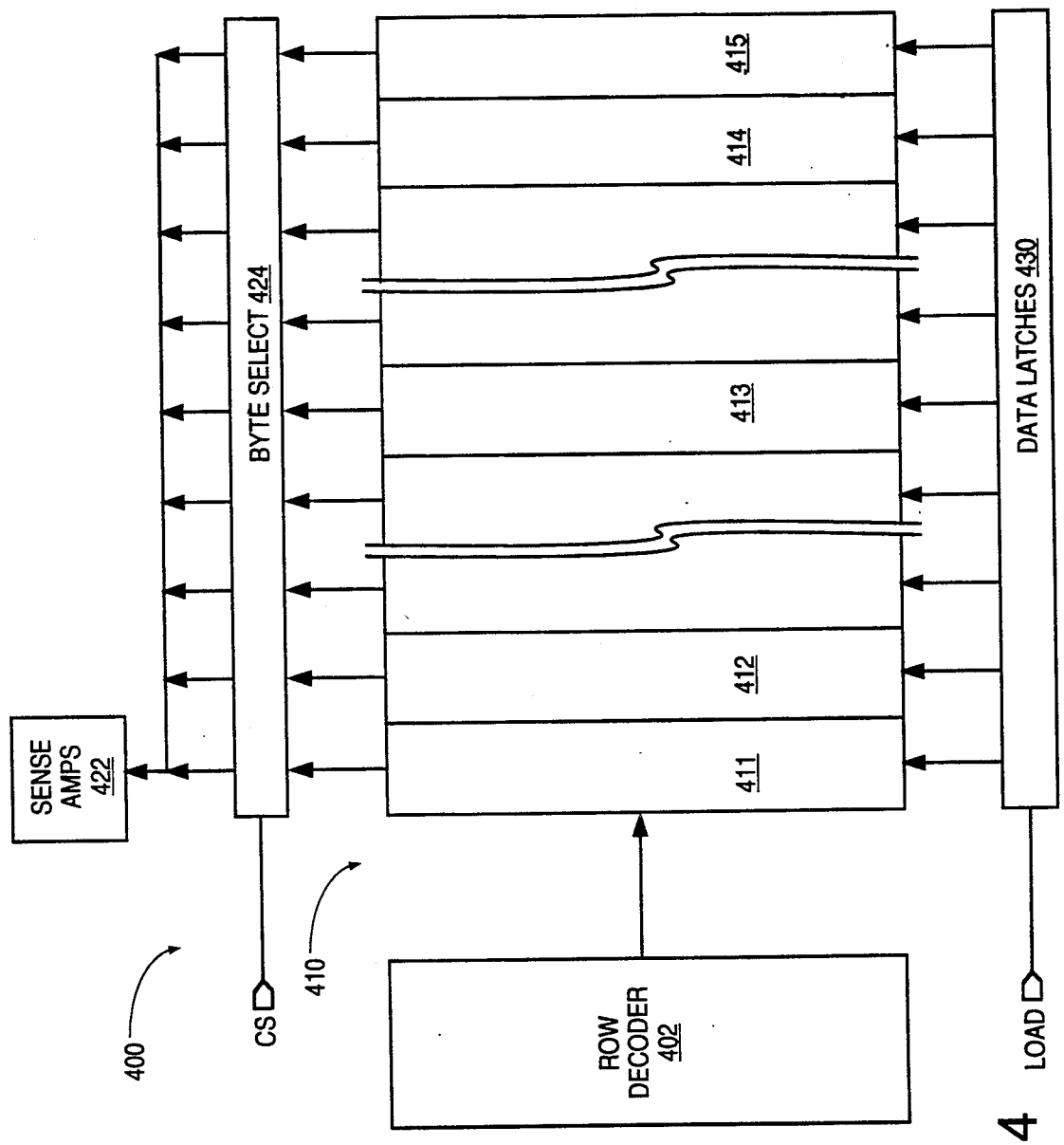
FIG. 4 is a circuit schematic diagram of another electrically erasable programmable read-only memory architecture, in accordance with the invention.

The use of monitor bytes instead of monitor bits has utility in a page organized memory architecture such as that shown in FIG. 4. The memory 400 includes a row decoder 402 and a memory array 410. The memory array 410 includes a number of columns represented by columns 411, 412, 413, 414 and 415. Each column is one byte wide, for example. Data is loaded in page mode through the data latches 430. Data is read by accessing individual bytes of data through byte select circuit 424, and each byte is sensed by byte-wide sense amplifier circuit 422. End columns 411 and 415 and center column 413 contain monitor bytes. The bits of the monitor bytes are first erased into logic one by loading logic ones into the associated latches of the data latches circuit 430 and selecting the appropriate word or words, and then programmed to logic zero by loading logic zeros into the associated latches of the data latches circuit 430 and selecting the appropriate word. The monitor bytes 411, 413 and 415 are sampled without dedicated circuitry by being selected by byte select circuit 424 and sensed by the sense amplifiers 422.

While the invention has been described with respect to the embodiments set forth above, the invention is not necessarily limited to these embodiments. For example, the invention is not necessarily limited to the particular arrangement of transistors described; to the specific supply voltages or signal voltages, or ranges of voltages, mentioned; or to the specific types of transistors or transistor characteristics set forth, as specific arrangements and values depend on the characteristics desired of the memory product. Accordingly, other embodiments, variations and improvements not described herein are not necessarily excluded from the scope of the invention, which is defined by the following claims.

What is claimed is:

1. A method of controlled programming of an electrically erasable programmable read only memory to prevent an excessively low threshold voltage from being stored in the memory cells thereof, comprising the steps of:
    erasing a group of memory cells of the memory into a high threshold state, the group including data cells and monitor cells;
    programming the data cells of the group in accordance with data presented to the memory;
    programming the monitor cells of the group toward a low threshold state;
    sampling the threshold voltage of the monitor cells; and
    repeating the data cell programming step, the monitor cell programming step and the sampling step until the threshold voltage corresponds to a low threshold state.

2. A method of controlled programming of an electrically erasable programmable read only memory to prevent an excessively low threshold voltage from being stored in the memory cells thereof, the memory being readable with a read voltage, comprising the steps of:
    erasing a group of memory cells of the memory into a high threshold state, the group including data cells and monitor cells;
    programming the data cells of the group in accordance with data presented to the memory;
    programming the monitor cells of the group toward a low threshold state;
    sampling the threshold voltage of the monitor cells with a sampling voltage less than the read voltage; and
    repeating the data cell programming step, the monitor cell programming step and the sampling step until the threshold voltage corresponds to a low threshold state.

3. A method of controlled programming of an electrically erasable programmable read only memory to prevent an excessively low threshold voltage from being stored in the memory cells thereof, comprising the steps of:
erasing a group of memory cells of the memory into a high threshold state, the group including data cells and monitor cells;
programming the data cells of the group in accordance with data presented to the memory;
programming the monitor cells of the group toward a low threshold state;
sampling the threshold voltage of the programmed monitor cells;
repeating the programming steps and the sampling step until an excessively low threshold voltage is sampled in one of the monitor cells;
incrementally erasing the programmed data cells and the programmed monitor cells of the group;
sampling the threshold voltage of the incrementally erased monitor cells; and
repeating the incrementally erasing step and the incrementally erased monitor cell sampling step until no excessively low threshold voltage is sampled.

4. The method of claim 1 wherein:
the programming steps include applying a constant voltage for a period of time to the data cells in accordance with the data presented and to the monitor cells.

5. The method of claim 4 wherein:
the period of time of the programming steps is uniform with each repeated programming step.

6. The method of claim 4 wherein:
the period of time of the programming steps is progressively shorter with each repeated programming step.

7. The method of claim 1 further comprising:
providing a voltage less than the sampling voltage to the group of monitor cells for sensing whether a monitor cell of the group has an excessively low threshold voltage, and, when a monitor cell of the group has an excessively low threshold voltage,
repeating the erasing, programming, sampling and repeating steps for the group of memory cells.

8. The method of claim 1 further comprising:
providing a voltage less than the sampling voltage to the group of monitor cells for sensing whether a monitor cell of the group has an excessively low threshold voltage, and, when a monitor cell of the group has an excessively low threshold voltage,
incrementally erasing the data cells and the monitor cells of the group;
sampling the threshold voltage of the incrementally erased monitor cells; and
repeating the incrementally erasing step and the incrementally erased monitor cell sampling step until no excessively low threshold voltage is sampled.

9. The method of claim 1 wherein
the monitor cells of the group of memory cells are data cells which, in accordance with the data presented to the memory, are programmed to a low threshold state.

10. The method of claim 2 wherein:
the programming steps include applying a constant voltage for a period of time to the data cells in accordance with the data presented and to the monitor cells.

11. The method of claim 10 wherein:
the period of time of the programming steps is uniform with each repeated programming step.

12. The method of claim 10 wherein:
the period of time of the programming steps is progressively shorter with each repeated programming step.

13. The method of claim 2 further comprising:
providing a voltage less that the sampling voltage to the group of monitor cells for sensing whether a monitor cell of the group has an excessively low threshold voltage, and, when a monitor cell of the group has an excessively low threshold voltage,
repeating the erasing, programming, sampling and repeating steps for the group of memory cells.

14. The method of claim 2 further comprising:
providing a voltage less that the sampling voltage to the group of monitor cells for sensing whether a monitor cell of the group has an excessively low threshold voltage, and, when a monitor cell of the group has an excessively low threshold voltage,
incrementally erasing the data cells and the monitor cells of the group;
sampling the threshold voltage of the incrementally erased monitor cells; and
repeating the incrementally erasing step and the incrementally erased monitor cell sampling step until no excessively low threshold voltage is sampled.

15. The method of claim 2 wherein
the monitor cells of the group of memory cells are data cells which, in accordance with the data presented to the memory, are programmed to a low threshold state.

16. A method of programming memory cells of an electrically erasable programmable read only memory comprising the steps of:
erasing the memory cells into a high threshold state;
programming at least some of memory cells in accordance with data presented to the memory, at least one of the memory cells being programmed toward a low threshold state;
using the at least one memory cell as a monitor cell;
sampling a threshold voltage of the monitor cell; and
repeating the programming step, the using step and the sampling step until the threshold voltage of the sampled monitor cell corresponds to the low threshold state.

17. The method of claim 16 wherein
the group of memory cells includes data cells and the monitor cell; and
the data cells are programmed in accordance with data presented to the memory.

18. The method of claim 17 wherein:
the programming step includes applying a constant voltage for a period of time to the data cells in accordance with the data presented and to the monitor cell.

19. The method of claim 18 wherein:
the period of time of the programming step is uniform with each repeated programming step.

20. The method of claim 18 wherein:
the period of time of the programming step is progressively shorter with each repeated programming step.

21. The method of claim 17 further comprising:
providing a voltage less that the sampling voltage to the monitor cell for sensing whether the monitor cell has an excessively low threshold voltage, and, when the monitor cell has an excessively low threshold voltage, repeating the erasing, programming, sampling and repeating steps for the group of memory cells.

22. The method of claim 17 further comprising:
providing a voltage less than the sampling voltage to the monitor cell for sensing whether the monitor cell has an excessively low threshold voltage, and, when the monitor cell has an excessively low threshold voltage,
incrementally erasing the data cells and the monitor cells of the group;
sampling the threshold voltage of the incrementally erased monitor cells; and
repeating the incrementally erasing step and the incrementally erased monitor cell sampling step until no excessively low threshold voltage is sampled.

23. An electrically erasable programmable read only memory comprising:
a group of memory cells, the group including data cells and monitor cells;
erasing means for erasing the group of memory cells of the memory into a high threshold state;
programming means for programming the data cells of the group in accordance with data presented to the memory;
programming means for programming the monitor cells of the group toward a low threshold state;
sampling means for sampling the threshold voltage of the monitor cells; and
means for causing the data cell programming means, the monitor cell programming means and the sampling means to repeat until the threshold voltage corresponds to a low threshold state.

24. The memory of claim 23 wherein:
the means for programming include means for applying a constant voltage for a period of time to the data cells in accordance with the data presented and to the monitor cells.

25. The memory of claim 24 wherein:
the means for applying use a uniform period of time with each repeated programming.

26. The memory of claim 24 wherein:
the means for applying use a progressively shorter period of time with each repeated programming.

27. The memory of claim 23 further comprising:
means for providing a voltage less than the sampling voltage to the monitor cell; and
means for sensing whether the monitor cell has an excessively low threshold voltage, and, for when the monitor cell has an excessively low threshold voltage,
the sensing means further including means for repeating the erasing, programming, sampling and repeating steps for the group of memory cells.

28. The method of claim 23 further comprising:
means for providing a voltage less than the sampling voltage to the monitor cell; and
means for sensing whether the monitor cell has an excessively low threshold voltage and, for when the monitor cell has an excessively low threshold voltage, the sensing means further including
means for incrementally erasing the data cells and the monitor cells of the group;
means for sampling the threshold voltage of the incrementally erased monitor cells; and
means for repeating the incrementally erasing step and the incrementally erased monitor cell sampling step until no excessively low threshold voltage is sampled.

* * * * *